(12) United States Patent
Yang et al.

(10) Patent No.: US 8,803,478 B2
(45) Date of Patent: Aug. 12, 2014

(54) ANALOG SWITCH, BATTERY PACK INCLUDING THE SAME AND BATTERY VOLTAGE MEASURING METHOD

(75) Inventors: Jongwoon Yang, Yongin-si (KR); Susumu Segawa, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 446 days.

(21) Appl. No.: 13/167,623

(22) Filed: Jun. 23, 2011

(65) Prior Publication Data

US 2012/0139548 A1  Jun. 7, 2012

(30) Foreign Application Priority Data

Dec. 1, 2010  (KR) .......................... 10-2010-0121326

(51) Int. Cl.
*H02J 7/00* (2006.01)
*G01R 31/36* (2006.01)

(52) U.S. Cl.
CPC ............. *G01R 31/362* (2013.01); *H02J 7/0029* (2013.01); *H02J 7/0021* (2013.01); *G01R 31/3658* (2013.01)
USPC ........... 320/118; 320/119; 324/426; 324/429; 324/433

(58) Field of Classification Search
USPC .................. 320/118, 119; 324/426, 429, 433
See application file for complete search history.

(56) References Cited

U.S. PATENT DOCUMENTS

| 6,104,164 A | 8/2000 | Iino et al. |
| 6,362,627 B1 | 3/2002 | Shimamoto et al. |
| 6,377,429 B1 | 4/2002 | Descombes |
| 7,365,528 B2 * | 4/2008 | Kawamura .................... 324/131 |
| 7,592,744 B2 * | 9/2009 | Lee ................................ 313/504 |
| 7,592,774 B2 * | 9/2009 | Morimoto ..................... 320/116 |
| 2004/0160229 A1 | 8/2004 | Fujita et al. |
| 2009/0128094 A1 | 5/2009 | Okuto |
| 2009/0179650 A1 * | 7/2009 | Omagari ....................... 324/433 |
| 2010/0174499 A1 | 7/2010 | Kang et al. |

FOREIGN PATENT DOCUMENTS

| JP | 11-248757 | 9/1999 |
| JP | 2000-199771 | 7/2000 |
| JP | 2000-341866 | 12/2000 |

(Continued)

OTHER PUBLICATIONS

Machine English Translation of JP 2002-040064.

(Continued)

*Primary Examiner* — Samuel Berhanu
(74) *Attorney, Agent, or Firm* — Christie, Parker & Hale, LLP

(57) ABSTRACT

A battery pack is provided. The battery pack includes first battery cells, a second battery cell coupled to one of the first battery cells, a voltage sensing and balancing circuit for measuring voltages of the first battery cells and for maintaining voltage balance between the first battery cells, a controller that includes an analog-to-digital (A/D) converter, and an analog switch for measuring a voltage value of the second battery cell and for transferring the measured voltage value to the A/D converter. The controller is for controlling charging and discharging of the first and second battery cells. The analog switch includes a flying capacitor, a first switch unit for transferring a voltage between the second battery cell and the flying capacitor, a second switch unit for transferring a voltage of the flying capacitor to the A/D converter, and a first diode for protecting a voltage source from a surge current.

13 Claims, 4 Drawing Sheets

(56) References Cited

FOREIGN PATENT DOCUMENTS

| | | |
|---|---|---|
| JP | 2002-040064 | 2/2002 |
| JP | 2004-251708 | 9/2004 |
| KR | 10-2009-0020470 A | 2/2009 |
| KR | 2009-0050932 | 5/2009 |

OTHER PUBLICATIONS

English Machine Translation of JP Patent Publication No. 11-2487575 dated Sep. 17, 1999, 5 pages.

English Machine Translation of JP Patent Publication No. 2004-251708 dated Sep. 9, 2004, 15 pages.

* cited by examiner

ANALOG SWITCH, BATTERY PACK INCLUDING THE SAME AND BATTERY VOLTAGE MEASURING METHOD

CROSS-REFERENCE TO RELATED APPLICATION

This application claims priority to and the benefit of Korean Patent Application No. 10-2010-0121326, filed on Dec. 1, 2010 in the Korean Intellectual Property Office, the entire content of which is herein incorporated by reference herein.

BACKGROUND

1. Field

Aspects of embodiments according to the present invention relate to an analog switch, a battery pack including the same, and a battery voltage measuring method.

2. Description of the Related Art

Generally, portable electric devices such as portable notebook computers and portable power tools have a chargeable battery pack. Such a battery pack may include a plurality of battery cells, a voltage sensing and balancing circuit that senses the voltage of each of the battery cells and maintains voltage balance between them, and a controller that controls the charging and discharging of each of the battery cells.

For example, in the battery pack equipped in a device such as a portable power tool, some of the battery cells are coupled to the voltage sensing and balancing circuit, and voltages are measured. However, since the number of input ports of the voltage sensing and balancing circuit may be limited, some of the battery cells may not be coupled to the voltage sensing and balancing circuit. Furthermore, such battery cells may be coupled to an analog-to-digital (A/D) converter that is included in the controller, thereby transferring the voltage values of these battery cells.

SUMMARY

An aspect of embodiments according to the present invention provides for a battery pack that corrects variation based on temperature when measuring the voltage of a battery cell and applying the measured voltage to an analog-to-digital (A/D) converter. Another aspect of embodiments according to the present invention provides for a method that corrects variation based on temperature when measuring the voltage of a battery cell and applying the measured voltage to an A/D converter.

In an exemplary embodiment according to the present invention, an analog switch is provided. The analog switch includes a flying capacitor having first and second terminals, a first switch unit coupled to the first and second terminals of the flying capacitor and configured to transfer a voltage between first and second terminals of a battery to the flying capacitor, a second switch unit coupled to the first terminal of the flying capacitor and configured to transfer a voltage of the flying capacitor to an analog-to-digital (A/D) converter, and a first diode coupled between the second terminal of the flying capacitor and a first capacitor for storing a supply voltage. The first diode is configured to protect a voltage source from a surge current.

The analog switch may further include a second diode coupled to the first diode in parallel.

The first and second diodes may have a same temperature characteristic.

The first and second diodes may be implemented in one package.

The first switch unit may include a first transistor, a second transistor, and a third transistor. The first transistor includes a grounded first electrode, a second electrode, and a control electrode for receiving a first control signal for controlling voltage sensing of the battery. The second transistor includes a first electrode that is coupled to the first terminal of the battery, a second electrode that is coupled to the first terminal of the flying capacitor, and a control electrode that is coupled to the second electrode of the first transistor. The third transistor includes a first electrode that is coupled to the second terminal of the battery, a second electrode that is coupled to the second terminal of the flying capacitor, and a control electrode that is coupled to the second electrode of the first transistor.

The second switch unit may include a fourth transistor and a fifth transistor. The fourth transistor includes a grounded first electrode, a second electrode, and a control electrode for receiving a second control signal for controlling a voltage that is transferred to the A/D converter. The fifth transistor includes a first electrode that is coupled to the first terminal of the flying capacitor, a second electrode that is coupled to the A/D converter, and a control electrode that is coupled to the second electrode of the fourth transistor.

The analog switch may further include a second diode coupled to the first diode in parallel. The second diode may include an anode coupled to the A/D converter and a cathode coupled to the control electrode of the fifth transistor.

According to another exemplary embodiment of the present invention, a battery pack is provided. The battery pack includes a plurality of first battery cells, a second battery cell coupled to one of the first battery cells, a voltage sensing and balancing circuit for measuring voltages of the first battery cells and for maintaining voltage balance between the first battery cells, a controller that includes an analog-to-digital (A/D) converter, and an analog switch unit for measuring a voltage value of the second battery cell and for transferring the measured voltage value of the second battery cell to the A/D converter. The controller is for controlling charging and discharging of the first and second battery cells. The analog switch unit includes a flying capacitor having first and second terminals, a first switch unit coupled to the first and second terminals of the flying capacitor and configured to transfer a voltage between first and second terminals of the second battery cell to the flying capacitor, a second switch unit coupled to the first terminal of the flying capacitor and configured to transfer a voltage of the flying capacitor to the A/D converter, and a first diode coupled between the second terminal of the flying capacitor and a first capacitor for storing a supply voltage. The first diode is configured to protect a voltage source from a surge current.

The battery pack may further include a voltage correction unit for correcting the measured voltage value of the second battery cell. The voltage correction unit may include a second diode coupled to the first diode in parallel.

The voltage correction unit may be configured to measure a first voltage value of the first diode when measuring the voltage value of the second battery cell, and to reflect a difference between the first voltage value and a second voltage value in the measured voltage value of the second battery cell to correct the measured voltage value. The second voltage value may be a driving voltage value of the second diode that has been measured at room temperature.

The voltage correction unit may be configured to measure the first voltage value using the equation $$V_{f1}=(V_{reg} \times V_{AD}) \div 2^M,$$

where $V_{f1}$ denotes the first voltage value, $V_{reg}$ denotes a reference voltage value of the A/D converter, $V_{AD}$ denotes a driving voltage value of the second diode when measuring the voltage value of the second battery cell, and M denotes a number of bits of the A/D converter.

The voltage correction unit may be configured to subtract the second voltage value from the first voltage value to produce a first difference, and to add the first difference to the measured voltage value of the second battery cell to correct the measured voltage value.

According to yet another exemplary embodiment of the present invention, a method of measuring a battery voltage value is provided. The method uses a flying capacitor for storing a voltage of a battery, a plurality of switches, and an analog switch that includes the flying capacitor and a first diode for protecting a voltage source from a surge current. The method includes: measuring a voltage value of the battery with the analog switch; measuring a first voltage value of the first diode when measuring the voltage value of the battery, with a second diode that is coupled to the first diode in parallel; and correcting the measured voltage value of the battery. The correcting includes reflecting a difference between the first voltage value and a second voltage value in the measured voltage value of the battery to correct the measured voltage value. The second voltage value is a driving voltage value of the second diode that has been measured at room temperature.

The measuring of the first voltage value may use the equation $$V_{f1}=(V_{reg} \times V_{AD}) \div 2^M,$$

where $W_{f1}$ denotes the first voltage value, $V_{reg}$ denotes a reference voltage value of an analog-to-digital (A/D) converter configured to receive the measured voltage value of the battery, $V_{AD}$ denotes a driving voltage value of the second diode when measuring the voltage value of the battery, and M denotes a number of bits of the A/D converter.

The correcting of the measured voltage value of the battery may include subtracting the second voltage value from the first voltage value to produce a first difference, and adding the first difference to the measured voltage value of the battery to correct the measured voltage value.

BRIEF DESCRIPTION OF THE DRAWINGS

The accompanying drawings are included to provide a further understanding of embodiments of the present invention, and are incorporated in and constitute a part of this application. The drawings illustrate exemplary embodiments of the present invention and, together with the description, serve to explain aspects and principles of the present invention. In the drawings.

DETAILED DESCRIPTION

Figure 1:
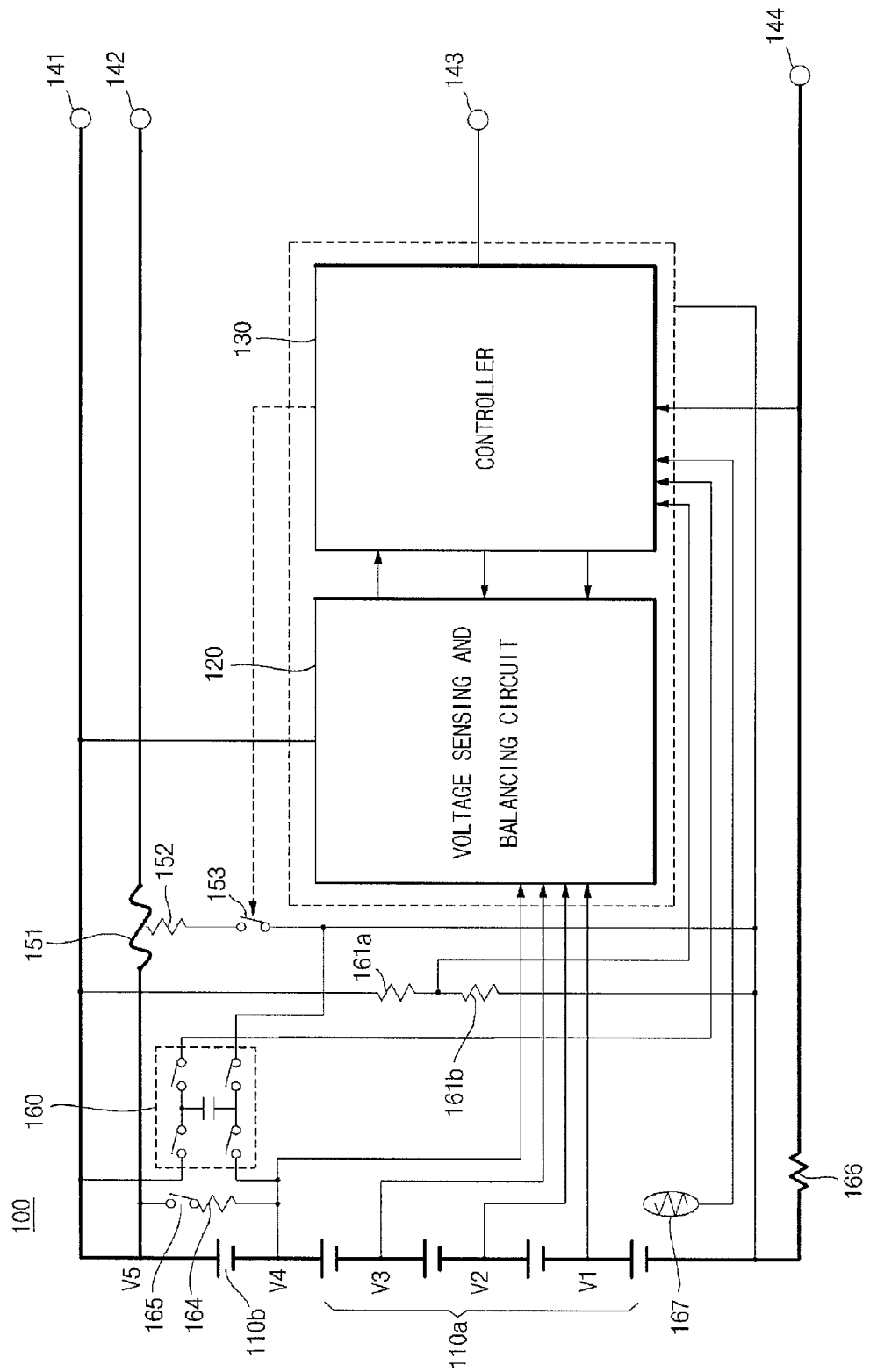
FIG. 1 is a block diagram illustrating a battery pack according to an embodiment.

Example embodiments will now be described more fully hereinafter with reference to the accompanying drawings; however, they may be embodied in different forms and should not be construed as limited to the embodiments set forth herein. Rather, these embodiments are provided to more fully convey the scope of the invention to those skilled in the art. In addition, when a first element is referred to as being "coupled to" a second element, the first element may be directly coupled (for example, connected) to the second element or indirectly coupled (for example, electrically connected) to the second element through one or more third elements therebetween. Finally, like reference numerals refer to like elements throughout.

FIG. 1 is a block diagram illustrating a battery pack 100 according to an embodiment.

Referring to FIG. 1, the battery pack 100 includes a plurality of battery cells 110a and 110b, a voltage sensing and balancing circuit 120, and a controller 130. The battery cells 110a and 110b are coupled in series, and may be charged or discharged. Each of the battery cells 110a and 110b may be a lithium ion battery chargeable to about 4.2 V, but they are not limited thereto. In the exemplary battery pack 100 of FIG. 1, the battery cells 110a and 110b are divided into first battery cells 110a including four serially-coupled battery cells, and second battery cell 110b as a fifth battery cell.

The voltage sensing and balancing circuit 120 may sense the voltage of each of the first battery cells 110a and concurrently (for example, simultaneously) perform voltage balancing of the first battery cells. The voltage sensing and balancing circuit 120 may supply a power to the controller 130, and transfer voltage information sensed from each of the first battery cells 110a to an analog-to-digital (A/D) converter of the controller 130. The voltage sensing and balancing circuit 120 may include various types of analog front ends manufactured for a lithium ion battery, but it is not limited thereto.

The controller 130 includes the A/D converter. The controller 130 may provide a charge/discharge control signal and a balancing control signal, which correspond to data processed by a program or an algorithm, to the voltage sensing and balancing circuit 120. The data processed by the program or the algorithm may be voltage information of the battery cells 110a and 110b. The controller 130 may include one or more types of microcomputers manufactured for a lithium ion battery, but it is not limited thereto.

The battery pack 100 includes a discharging terminal 141 for discharging the battery cells 110a and 110b, a charging terminal 142 for charging the battery cells 110a and 110b, a communication terminal 143 for single wire communication with an external device, and a negative electrode terminal 144 for charging/discharging the battery cells 110a and 110b. The discharging terminal 141 and the charging terminal 142 are electrically connected to the positive electrodes of the battery cells 110a and 110b. The negative electrode terminal 144 is electrically connected to the negative electrode of the battery cells 110a and 110b. The communication terminal 143 is electrically connected to the controller 130.

The battery pack 100 includes a fuse 151 that is coupled between the charging terminal 142 and the battery cells 110a and 110b, and prevents or helps to prevent overcharging the battery pack 100. As illustrated in FIG. 1, a heating resistor 152 and a switch 153 are coupled to the fuse 151; together, these elements constitute an overcharge prevention circuit. The switch 153 may be turned on/off by a control signal of the controller 130. In other embodiments, however, the overcharge prevention circuit is not limited thereto. For example, in other embodiments, the overcharge prevention circuit may be configured with a plurality of field effect transistors (FETs).

The battery pack 100 includes the five serially-coupled battery cells 110a and 110b. That is, as described above, the battery pack 100 includes the four first battery cells 110a and the second battery cell 110b as the fifth battery cell. However, the voltage sensing and balancing circuit 120 is designed to sense only a voltage for each of the first battery cells 110a. That is, unless a circuit is changed, the voltage of the second battery cell 110b cannot be sensed by the voltage sensing and balancing circuit 120 while each of the first battery cells is coupled to the voltage sensing and balancing circuit 120.

Therefore, the battery pack 100 further includes an analog switch unit 160 for voltage sensing of the second battery cell 110b. The analog switch unit 160 is coupled in parallel between the positive electrode and the negative electrode of the second battery cell 110b. The analog switch unit 160 may sense and store the voltage of the second battery cell 110b, and transfer the sensed voltage to the A/D converter of the controller 130. Hereinafter, the analog switch unit 160 according to an embodiment will be described in detail.

Figure 2:
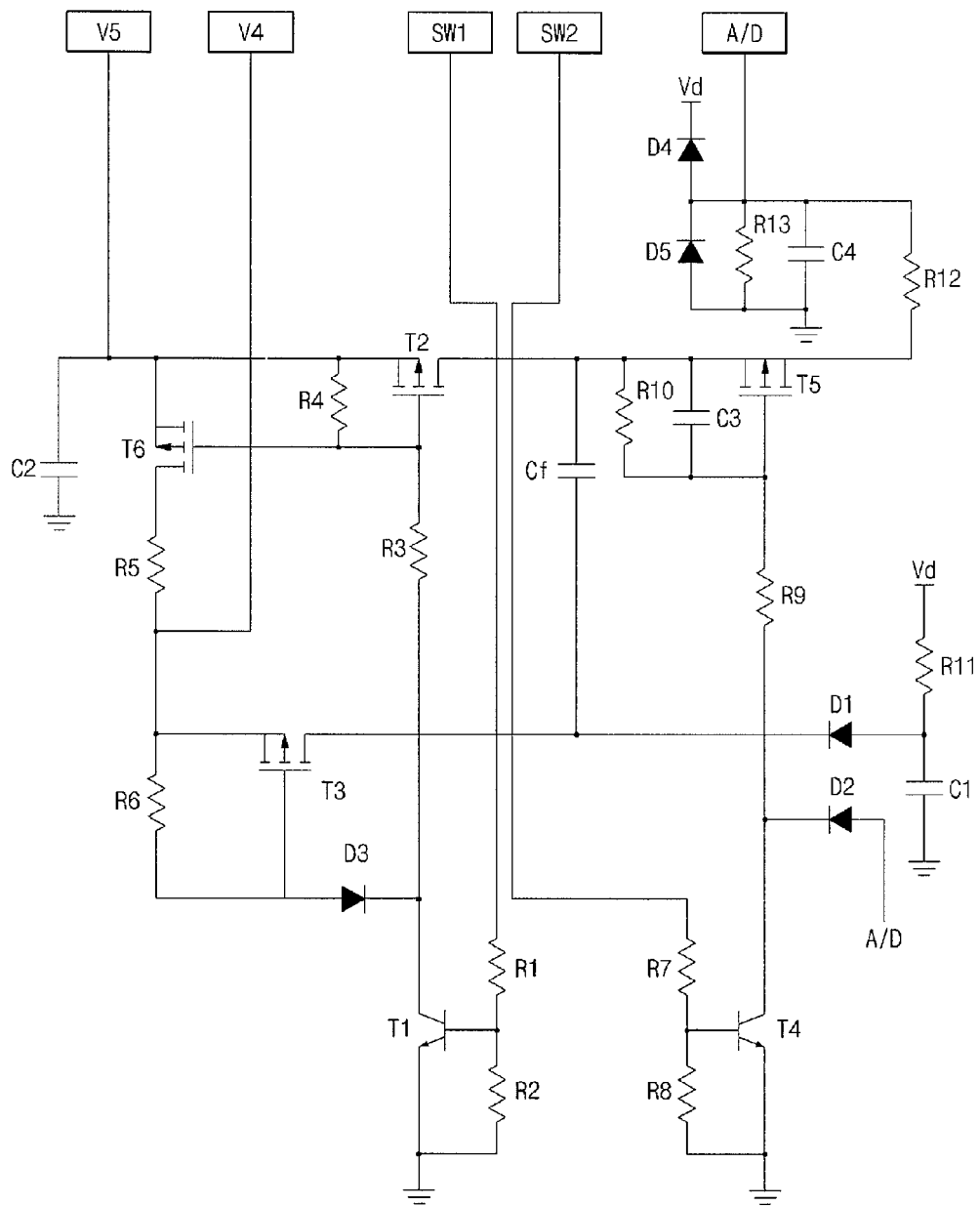
FIG. 2 is a circuit diagram illustrating an analog switch unit according to an embodiment.

FIG. 2 is a circuit diagram illustrating the analog switch unit 160 according to an embodiment.

Referring to FIG. 2, the analog switch unit 160 includes a flying capacitor Cf, a first switch unit (corresponding to first through third transistors T1 to T3 and sixth transistor T6, and receives a first control signal SW1), a third diode D3, and a second switch unit (corresponding to fourth and fifth transistors T4 and T5, and receives a second control signal SW2).

The flying capacitor Cf has first and second terminals, and may store a voltage corresponding to the voltage difference between the first and second terminals V5 and V4 of the second battery cell 110b. The first terminal V5 may be a positive electrode terminal of the second battery cell 110b, and the second terminal V4 may be a negative electrode terminal of the second battery cell 110b. In the following description, the first terminal V5 of the second battery cell 110b is defined as the positive electrode terminal, and the second terminal V4 of the second battery cell 110b is defined as the negative electrode terminal.

The first switch unit may transfer the voltage corresponding to the voltage difference between the positive electrode terminal V5 and the negative electrode terminal V4 of the second battery cell 110b to the flying capacitor Cf and store the voltage in the flying capacitor Cf. The first switch unit includes the first to third transistors T1 to T3 and the sixth transistor T6.

The first transistor T1 includes a first electrode, a second electrode, and a control electrode. The first electrode of the first transistor T1 is coupled to ground (that is, the first transistor T1 is a grounded electrode). The control electrode of the first transistor T1 receives the first control signal SW1 (for controlling voltage sensing of the second battery cell 110b) from the controller 130. A first resistor R1 is coupled between the control electrode of the first transistor T1 and the controller 130. In addition, a second resistor R2 is coupled between the control electrode and the first electrode of the first transistor T1. Accordingly, the first control signal SW1 is voltage-divided by the first and second resistors R1 and R2, and applied to the control electrode of the first transistor T1.

The second transistor T2 includes a first electrode, a second electrode, and a control electrode. The control electrode of the second transistor T2 is coupled to the second electrode of the first transistor T1. A third resistor R3 is coupled between the control electrode of the second transistor T2 and the second electrode of the first transistor T1. Therefore, when the first transistor T1 is turned on, the second transistor T2 receives a signal through the control electrode and thereby be turned on. The first electrode of the second transistor T2 is coupled to the positive electrode terminal V5 of the second battery cell 110b. A fourth resistor R4 is coupled between the first electrode and the control electrode of the second transistor T2. The second electrode of the second transistor is coupled to the first terminal of the flying capacitor Cf. Accordingly, when the second transistor T2 is turned on, the voltage of the positive electrode terminal V5 of the second battery cell 110b is applied to the first terminal of the flying capacitor Cf.

The third transistor T3 includes a first electrode, a second electrode, and a control electrode. The control electrode of the third transistor T3 is coupled to the second electrode of the first transistor T1. The third diode D3 is coupled between the control electrode of the third transistor T3 and the second electrode of the first transistor T1. The anode of the third diode D3 is coupled to the control electrode of the third transistor T3, and the cathode of the third diode D3 is coupled to the second electrode of the first transistor T1. The third diode D3 shuts off a surge current that is applied through the ground coupled to the first electrode of the first transistor T1. Therefore, when the first transistor T1 is turned on, the third transistor T3 is turned on.

In addition, the first electrode of the third transistor T3 is coupled to the negative electrode terminal V4 of the second battery cell 110b. A sixth resistor R6 is coupled between the first electrode and the control electrode of the third transistor T3. The second electrode of the third transistor T3 is coupled to the second terminal of the flying capacitor Cf. Therefore, when the first transistor T1 is turned on, the voltage of the negative electrode terminal V4 of the second battery cell 110b is applied to the second terminal of the flying capacitor Cf through the third transistor T3.

The sixth transistor T6 includes a first electrode, a second electrode, and a control electrode. The control electrode of the sixth transistor T6 is coupled to the second electrode of the first transistor T1. The third resistor R3 is coupled between the control electrode of the sixth transistor T6 and the second electrode of the first transistor T1. Therefore, when the first transistor T1 is turned on, the sixth transistor T6 is turned on. The first electrode of the sixth transistor T6 is coupled to the positive electrode terminal V5 of the second battery cell 110b. A second capacitor C2 is coupled between the positive electrode terminal V5 of the second battery cell 110b and the ground. The second electrode of the sixth transistor T6 is coupled to the first electrode of the third transistor T3. A fifth resistor R5 is coupled between the second electrode of the sixth transistor T6 and the first electrode of the third transistor T3.

A first diode D1 is coupled between the second terminal of the flying capacitor Cf and a first capacitor C1 for storing a supply voltage Vd. More specifically, the anode of the first diode D1 is coupled to the first terminal of the first capacitor C1, and the cathode of the first diode D1 is coupled to the second terminal of the flying capacitor Cf. The second terminal of the first capacitor C1 is coupled to the ground. An eleventh resistor R11 is coupled between the voltage source Vd and the first capacitor C1. Therefore, the supply voltage Vd is applied to and stored in the first capacitor C1.

The second switch unit is coupled between the flying capacitor Cf and the A/D converter of the controller 130, and transfers the voltage of the flying capacitor Cf to the A/D converter. The second switch unit includes the fourth and fifth transistors T4 and T5.

The fourth transistor T4 includes a first electrode, a second electrode, and a control electrode. The first electrode of the fourth transistor T4 is coupled to the ground. The control electrode of the fourth transistor T4 receives the second control signal SW2 (for controlling a voltage transferred to the A/D converter) from the controller 130. A seventh resistor R7 is coupled between the control electrode of the fourth transistor T4 and the controller 130. In addition, an eighth resistor R8 is coupled between the control electrode and the first electrode of the fourth transistor T4. Therefore, the second control signal SW2 is voltage-divided by the seventh and eighth resistors R7 and R8, and applied to the control electrode of the fourth transistor T4.

The fifth transistor T5 includes a first electrode, a second electrode, and a control electrode. The control electrode of the fifth transistor T5 is coupled to the second electrode of the fourth transistor T4. A ninth resistor R9 is coupled between the control electrode of the fifth transistor T5 and the second electrode of the fourth transistor T4. The first electrode of the fifth transistor T5 is coupled to the first terminal of the flying capacitor Cf. A tenth resistor R10 and a third capacitor C3 are coupled in parallel between the first electrode and the control electrode of the fifth transistor T5. The tenth resistor R10 and the third capacitor C3 allow the gate-source voltage of the fifth transistor T5 to increase through a transient time, thereby preventing the fifth transistor T5 from turning on concurrently (for example, simultaneously) with the second transistor T2 and the third transistor T3. The second electrode of the fifth transistor T5 is coupled to the A/D converter.

A twelfth resistor R12, a fourth capacitor C4, a thirteenth resistor R13, a fourth diode D4, and a fifth diode D5 are disposed between the second electrode of the fifth transistor T5 and the A/D converter. The first terminal of the twelfth resistor R12 is coupled to the second electrode of the fifth transistor T5, and the second terminal of the twelfth R12 is coupled to the first terminal of the fourth capacitor C4. The second terminal of the fourth capacitor C4 is coupled to the ground. The thirteenth resistor R13 is coupled to the fourth capacitor C4 in parallel. That is, the first terminal of the thirteenth resistor R13 is coupled to the first terminal of the fourth capacitor C4, and the second terminal of the thirteenth resistor R13 is coupled to the ground. Further, the first terminal of the thirteenth resistor R13 is coupled to the A/D converter. The cathode of the fifth diode D5 is coupled to the first terminal of the thirteenth resistor R13, and the anode of the fifth diode D5 is coupled to the second terminal of the thirteenth resistor R13. The fourth diode D4 is coupled between the voltage source Vd and the cathode of the fifth diode D5.

The fourth capacitor C4 is coupled between the twelfth resistor R12 and the ground, stores energy applied from the fifth transistor T5, and allows the stored energy to be applied to the A/D converter of the controller 130. The thirteenth resistor R13 and the fourth capacitor C4 allow a voltage applied from the fifth transistor T5 to be applied to the A/D converter through a transient time. The fourth diode D4 shuts off a surge current applied from the voltage source Vd. The fifth diode D5 compensates the driving voltage of the fourth diode D4 when the surge current is applied. Therefore, the driving voltage of the fourth diode D4 can be prevented from changing due to temperature. In order for the fifth diode D5 to have the same temperature characteristic as that of the fourth diode D4, also, the fourth and fifth diodes D4 and D5 may be implemented as one package.

Referring back to FIG. 1, voltage-dividing resistors 161a and 161b are coupled between the discharge terminal 141 and the negative electrode terminal 144, and output the total voltages of the battery pack 100 to the controller 130.

Hereinafter, the operation of the analog switch unit 160 according to the embodiment of FIG. 2 will be described in detail. First, when the first control signal SW1 is applied, the voltage of the second resistor R2 is applied to the control electrode of the first transistor T1. Therefore, the first transistor T1 is turned on. Furthermore, a current flowing through the first transistor T1 allows a voltage to be applied to the control electrodes of the second and third transistors T2 and T3, thereby turning on the second and third transistors T2 and T3.

As a result, the potential "V5" of the positive electrode terminal of the second battery cell 110b is transferred to the first electrode of the flying capacitor Cf through the second transistor T2. In addition, the potential "V4" of the negative electrode terminal of the second battery cell 110b is transferred to the second electrode of the flying capacitor Cf through the third transistor T3. Therefore, a voltage corresponding to a potential difference "V5–V4" is stored between the two terminals of the flying capacitor Cf. The potential difference "V5–V4" is a voltage across the two terminals of the second battery cell 110b.

Next, when the first control signal SW1 is not applied but the second control signal SW2 is applied, the fourth transistor T4 is turned on. A voltage is applied to the control electrode of the fifth transistor T5 due to a current that flows through the first and second electrodes of the fourth transistor T4, and thus the fifth transistor T5 is turned on. At this point, the fifth transistor T5 is turned on through a transient time, according to a time constant of the tenth resistor R10 and the third capacitor C3.

As the fifth transistor T5 is turned on, the potential of the first electrode of the flying capacitor Cf is transferred to the twelfth resistor R12. The potential of the first electrode of the flying capacitor Cf is "(V5–V4)+(Vd–Vd1)", where Vd is the voltage of the voltage source Vd stored in the first capacitor C1 and Vd1 is the forward voltage value of the first diode D1. The potential of the first electrode of the flying capacitor Cf is voltage-divided by the twelfth resistor R12 and the thirteenth resistor R13, and the voltage of the thirteenth resistor R13 is finally transferred to the A/D converter. At this point, the voltage of the thirteenth resistor R13 is applied to the A/D converter through a transient time, according to a time constant of the thirteenth resistor R13 and the fourth capacitor C4.

The fourth diode D4 may prevent a surge current from being applied through the voltage source Vd. In addition, the fifth diode D5 offsets the forward driving voltage value of the fourth diode D4. Therefore, a voltage can be stably applied to the A/D converter.

The battery pack 100 detects the voltage of the fifth battery cell through the analog switch unit 160. The analog switch unit 160 includes a diode for protecting the voltage source Vd from the surge current. The voltage source Vd supplies the reference voltage of the A/D converter. The driving voltage of the diode of the analog switch unit 160 is shifted according to a change in temperature. When the voltage value of the diode is shifted, the reference voltage of the A/D converter is shifted, and therefore, an error of the measured voltage value of the battery cell may occur.

Accordingly, the battery pack 100 may further include a voltage correction unit for correcting a battery measurement voltage value that is measured through the analog switch 160. Hereinafter, the voltage correction unit according to an embodiment will be described in detail.

Referring to FIG. 2, the voltage correction unit includes a second diode D2 that is coupled to the first diode D1 in parallel. The anode of the second diode D2 is coupled to the A/D converter of the controller 130, and the cathode of the second diode D2 is coupled to the control electrode of the fifth transistor T5. However, the present invention is not limited thereto. For instance, in other embodiments, the second diode D2 may be coupled to the first diode D1 in parallel, and be driven in accordance with the driving of the first diode D1.

The voltage correction unit measures the driving voltage value of the second diode D2, and measures the driving voltage value of the first diode D1 based on the measured data of the second diode D2. The voltage correction unit that measures the driving voltage value of the first diode D1 may be included in the controller 130, or may be implemented independently of the controller 130.

Figure 3:
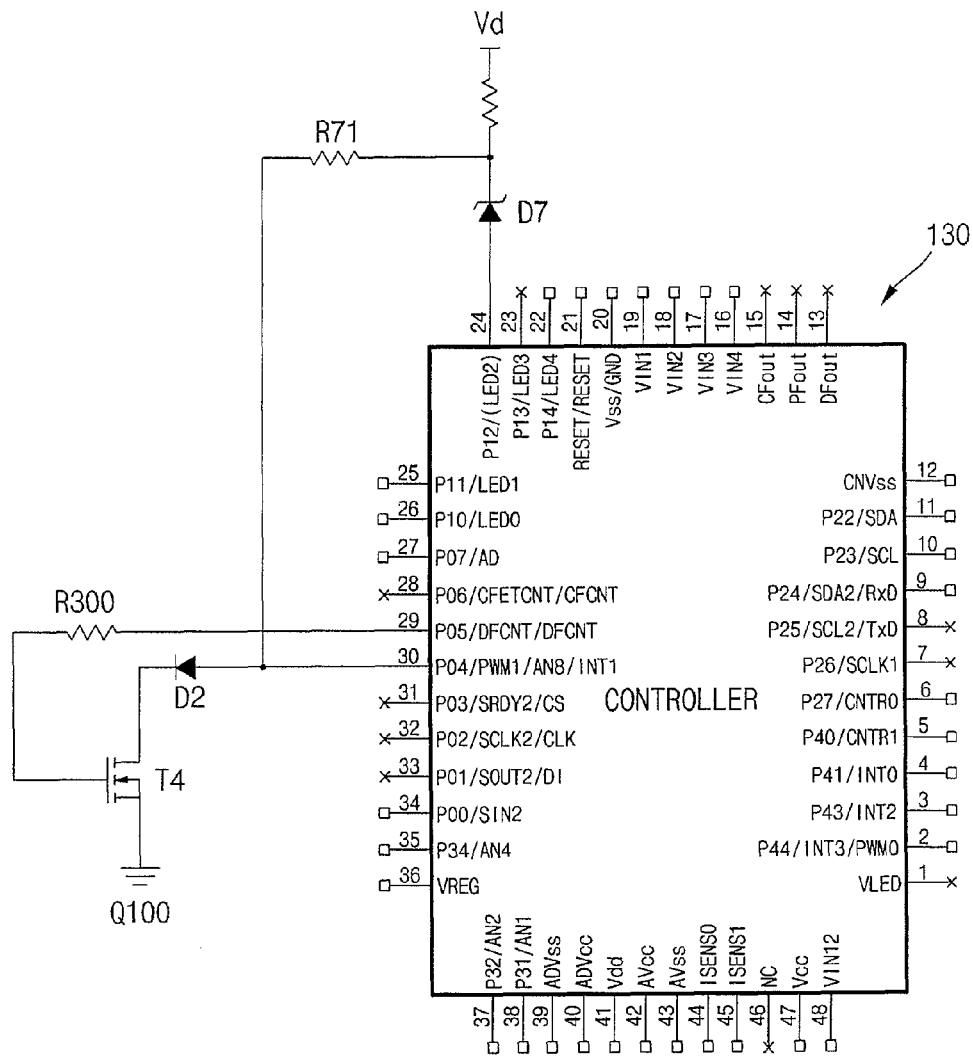
FIG. 3 is a diagram for illustrating a voltage measurement mode recognizing method and voltage measuring method of a voltage correction unit according to an embodiment.

FIG. 3 is a diagram for illustrating a voltage measurement mode recognizing method and voltage measuring method of a voltage correction unit according to an embodiment.

Referring to FIG. 3, first, a high signal is outputted to the port P05 of the controller 130, which corresponds to the second control signal SW2 in FIG. 2. Accordingly, the fourth transistor T4 is turned on.

Next, when the port P12 of the controller 130 is set to a high impedance, the voltage correction unit is coupled to the second diode D2 through a port P04 and recognizes a voltage measurement mode. The port P04 is coupled to the A/D converter (see also FIG. 2). In this case, the voltage correction unit may measure the driving voltage value of the second diode D2 through the port P04. At this point, the controller 130 may store the driving voltage value of the second diode D2 in a memory.

Moreover, the voltage correction unit may measure the driving voltage value (hereinafter referred to as a first voltage value) of the first diode D1 by using the driving voltage value of the second diode D2 when measuring a battery voltage. Such a measurement method may be expressed as in Equation (1) below.

$$V_{f1} = (V_{reg} \times V_{AD}) \div 2^M, \quad (1)$$

where $V_{f1}$ denotes the first voltage value, $V_{reg}$ denotes a reference voltage value provided to the A/D converter, $V_{AD}$ denotes the driving voltage value of the second diode D2 that has been measured by the voltage correction unit when measuring the battery voltage, and M denotes the number of bits of the A/D converter.

The voltage correction unit may correct the battery voltage value that has been measured through the analog switch unit 160, by using the first voltage value $V_{f1}$ and a second voltage value $V_{f2}$. The second voltage value $V_{f2}$ denotes the driving voltage value of the second diode D2 that has been measured at room temperature. The second voltage value $V_{f2}$ is measured by the voltage correction unit and is stored in the memory of the controller 130.

A voltage correction method of the voltage correction unit will be described as follows. First, the voltage correction unit subtracts the second voltage value $V_{f2}$ from the first voltage value $V_{f1}$. This difference represents a variation $\Delta V_f$ of the driving voltage value of the first diode D1 based on a change in temperature. Next, the voltage correction unit adds this voltage difference $\Delta V_f$ to the battery voltage value, which has been measured through the analog switch unit 160, to correct the battery measurement voltage value.

In the above description, it has been assumed that the driving voltages of the first and second diodes D1 and D2 are forward driving voltages. However, a reverse driving voltage value may be used. In a case of using the reverse driving voltage value, voltage correction may be performed by adding the absolute value of the second voltage value $V_{f2}$ subtracted from the first voltage value $V_{f1}$ to the battery voltage value that has been measured through the analog switch unit 160.

Therefore, the voltage correction unit may measure the variation of the driving voltage value of the first diode D1 based on a change in temperature by using data measured through the second diode D2 and reflect the measured variation in the battery measurement voltage value, thereby removing influence of a diode based on a change in temperature. The first and second diodes D1 and D2 may have the same temperature characteristic for more accurate voltage correction by the voltage correction unit. In addition, the first and second diodes D1 and D2 may be implemented as one package, for having the same temperature characteristic.

Hereinafter, a battery voltage measuring method according to an embodiment will be described with reference to the accompanying drawings.

Figure 4:
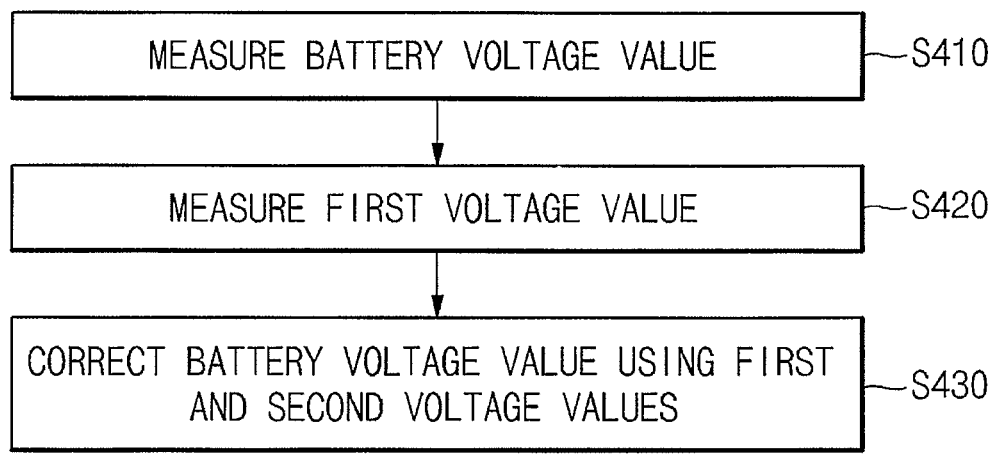
FIG. 4 is a flowchart illustrating a method of correcting a measured voltage of a battery, according to an embodiment.

FIG. 4 is a flowchart illustrating a method of correcting a measured voltage of a battery, according to an embodiment.

Referring to FIG. 4, a battery voltage measuring method includes a battery voltage value measuring operation S410, a first voltage value measuring operation S420, and a battery voltage value correcting operation S430. In the battery voltage value measuring operation S410, a battery voltage value is measured with the analog switch unit 160 according to the embodiment of FIG. 2. A voltage value measured through the battery voltage value measuring operation S410 is not directly inputted to the A/D converter, but undergoes a below-described correction operation and then is inputted to the A/D converter.

In the first voltage value measuring operation S420, the driving voltage value (hereinafter referred to as a first voltage value $V_{f1}$) of the first diode D1 of the analog switch unit 160 is measured by using the second diode D2 that is coupled to the first diode D1 in parallel along with Equation (1) and the accompanying technique described above.

In the battery voltage value correcting operation S430, the battery voltage value measured through the battery voltage value measuring operation S410 is corrected by using the first voltage value $V_{f1}$ measured through the first voltage value measuring operation S420 and a second voltage value $V_{f2}$). The second voltage value $V_{f2}$ denotes the driving voltage value of the second diode D2 that has been previously measured at room temperature. A battery voltage correcting method will be described below in more detail.

First, the second voltage value $V_{f2}$ is subtracted from the first voltage value $V_{f1}$ This difference represents a variation $\Delta V_f$ of the driving voltage value of the first diode D1 based on a change in temperature. Next, the battery measurement voltage value is corrected by adding the variation $\Delta V_f$ to the battery voltage value measured through the battery voltage value measuring operation S410.

In the above description, it has been assumed that the driving voltages of the first and second diodes D1 and D2 are forward driving voltages. However, a reverse driving voltage value may be used. In a case of using the reverse driving voltage value, voltage correction may be performed by adding the absolute value of the second voltage value $V_{f2}$ subtracted from the first voltage value $V_{f1}$ to the battery voltage value measured through the battery voltage value measuring operation S410.

Therefore, the voltage correction unit may measure the variation of the driving voltage value of the first diode D1 based on a change in temperature by using data measured through the second diode D2 and reflect the measured variation in the battery measurement voltage value, thereby removing influence of a diode based on a change in temperature.

According to embodiments of the present invention, a battery pack that corrects measured voltage variation based on temperature (when measuring the voltage of a battery cell and applying the measured voltage to an analog-to-digital (A/D)

converter) is provided. According to further embodiments of the present invention, a method that corrects measured voltage variation based on temperature (when measuring the voltage of a battery cell and applying the measured voltage to an A/D converter) is provided.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims, and equivalents thereof.

What is claimed is:

1. An analog switch for measuring a voltage value of a battery, the analog switch comprising:
    a flying capacitor comprising first and second terminals;
    a first switch unit coupled to the first and second terminals of the flying capacitor, the first switch unit being configured to transfer a voltage between first and second terminals of the battery to the flying capacitor;
    a second switch unit coupled to the first terminal of the flying capacitor, the second switch unit being configured to transfer a voltage of the flying capacitor to an analog-to-digital (A/D) converter;
    a first diode coupled between the second terminal of the flying capacitor and a first capacitor for storing a supply voltage, the first diode being configured to protect a voltage source of the supply voltage from a surge current, the first diode comprising an anode coupled to a first terminal of the first capacitor and a cathode coupled to the second terminal of the flying capacitor; and
    a voltage correction unit for correcting the measured voltage value of the battery, the voltage correction unit comprising a second diode coupled to the first diode in parallel, wherein
        the voltage correction unit is configured to measure a first voltage value of the first diode when measuring the voltage value of the battery, and to reflect a difference between the first voltage value and a second voltage value in the measured voltage value of the battery to correct the measured voltage value of the battery,
        the second voltage value is a driving voltage value of the second diode that has been measured at room temperature, and
        the voltage correction unit is further configured to measure the first voltage value using the equation $$V_{f1} = (V_{reg} \times V_{AD}) \div 2^M,$$

where $V_{f1}$ denotes the first voltage value, $V_{reg}$ denotes a reference voltage value of the A/D converter, $V_{AD}$ denotes a driving voltage value of the second diode when measuring the voltage value of the battery, and M denotes a number of bits of the A/D converter.

2. The analog switch as claimed in claim 1, wherein the first and second diodes have a same temperature characteristic.

3. The analog switch as claimed in claim 1, wherein the first and second diodes are implemented in one package.

4. The analog switch as claimed in claim 1, wherein the first switch unit comprises:
    a first transistor comprising a grounded first electrode, a second electrode, and a control electrode for receiving a first control signal for controlling voltage sensing of the battery;
    a second transistor comprising a first electrode that is coupled to the first terminal of the battery, a second electrode that is coupled to the first terminal of the flying capacitor, and a control electrode that is coupled to the second electrode of the first transistor; and
    a third transistor comprising a first electrode that is coupled to the second terminal of the battery, a second electrode that is coupled to the second terminal of the flying capacitor, and a control electrode that is coupled to the second electrode of the first transistor.

5. The analog switch as claimed in claim 1, wherein the second switch unit comprises:
    a fourth transistor comprising a grounded first electrode, a second electrode, and a control electrode for receiving a second control signal for controlling the voltage of the flying capacitor that is transferred to the A/D converter; and
    a fifth transistor comprising a first electrode that is coupled to the first terminal of the flying capacitor, a second electrode that is coupled to the A/D converter, and a control electrode that is coupled to the second electrode of the fourth transistor.

6. The analog switch as claimed in claim 5, wherein the second diode comprises an anode coupled to the A/D converter and a cathode coupled to the control electrode of the fifth transistor.

7. A battery pack comprising:
    a plurality of first battery cells;
    a second battery cell coupled to one of the first battery cells;
    a voltage sensing and balancing circuit for measuring voltages of the first battery cells, and for maintaining voltage balance between the first battery cells;
    a controller comprising an analog-to-digital (A/D) converter, the controller for controlling charging and discharging of the first and second battery cells; and
    an analog switch unit for measuring a voltage value of the second battery cell, and for transferring the measured voltage value of the second battery cell to the A/D converter, wherein the analog switch unit comprises:
        a flying capacitor comprising first and second terminals;
        a first switch unit coupled to the first and second terminals of the flying capacitor, the first switch unit being configured to transfer a voltage between first and second terminals of the second battery cell to the flying capacitor;
        a second switch unit coupled to the first terminal of the flying capacitor, the second switch unit being configured to transfer a voltage of the flying capacitor to the A/D converter;
        a first diode coupled between the second terminal of the flying capacitor and a first capacitor for storing a supply voltage, the first diode being configured to protect a voltage source of the supply voltage from a surge current, the first diode comprising an anode coupled to a first terminal of the first capacitor and a cathode coupled to the second terminal of the flying capacitor; and
        a voltage correction unit for correcting the measured voltage value of the second battery cell, the voltage correction unit comprising a second diode coupled to the first diode in parallel, wherein
            the voltage correction unit is configured to measure a first voltage value of the first diode when measuring the voltage value of the second battery cell, and to reflect a difference between the first voltage value and a second voltage value in the measured voltage value of the second battery cell to correct the measured voltage value of the second battery cell, the second voltage value is a driving voltage value of the second diode that has been measured at room temperature, and the voltage correction unit is further configured to measure the first voltage value using the equation $$V_{f1}=(V_{reg} \times V_{AD}) \div 2^M,$$

where $V_{f1}$ denotes the first voltage value, $V_{reg}$ denotes a reference voltage value of the A/D converter, $V_{AD}$ denotes a driving voltage value of the second diode when measuring the voltage value of the second battery cell, and M denotes a number of bits of the A/D converter.

8. The battery pack as claimed in claim 7, wherein the voltage correction unit is further configured to subtract the second voltage value from the first voltage value to produce a first difference, and to add the first difference to the measured voltage value of the second battery cell to correct the measured voltage value of the second battery cell.

9. The battery pack as claimed in claim 7, wherein the first and second diodes have a same temperature characteristic.

10. The battery pack as claimed in claim 7, wherein the first and second diodes are implemented in one package.

11. A method of measuring a battery voltage value using a flying capacitor for storing a voltage of a battery, a plurality of switches, and an analog switch comprising the flying capacitor having first and second terminals, a first capacitor, and a first diode for protecting a voltage source from a surge current, the method comprising:

measuring a voltage value of the battery with the analog switch;

measuring a first voltage value of the first diode when measuring the voltage value of the battery, with a second diode that is coupled to the first diode in parallel, the first diode comprising an anode coupled to a first terminal of the first capacitor and a cathode coupled to the second terminal of the flying capacitor; and correcting the measured voltage value of the battery, comprising reflecting a difference between the first voltage value and a second voltage value in the measured voltage value of the battery to correct the measured voltage value of the battery, wherein the second voltage value is a driving voltage value of the second diode that has been measured at room temperature, and wherein the measuring of the first voltage value uses the equation $$V_{f1}=(V_{reg} \times V_{AD}) \div 2^M,$$

where $V_{f1}$ denotes the first voltage value, $V_{reg}$ denotes a reference voltage value of an analog-to-digital (A/D) converter configured to receive the measured voltage value of the battery, $V_{AD}$ denotes a driving voltage value of the second diode when measuring the voltage value of the battery, and M denotes a number of bits of the A/D converter.

12. The method as claimed in claim 11, wherein the correcting of the measured voltage value of the battery comprises subtracting the second voltage value from the first voltage value to produce a first difference, and adding the first difference to the measured voltage value of the battery to correct the measured voltage value of the battery.

13. The method as claimed in claim 11, wherein the first and second diodes have a same temperature characteristic and are implemented in one package.

* * * * *